(12) United States Patent
Paz de Araujo et al.

(10) Patent No.: US 9,722,179 B2
(45) Date of Patent: Aug. 1, 2017

(54) TRANSITION METAL OXIDE RESISTIVE SWITCHING DEVICE WITH DOPED BUFFER REGION

(71) Applicant: Symetrix Memory, LLC, Colorado Springs, CO (US)

(72) Inventors: Carlos A. Paz de Araujo, Colorado Springs, CO (US); Jolanta Celinska, Colorado Springs, CO (US); Christopher R. McWilliams, Colorado Springs, CO (US)

(73) Assignee: Symetrix Memory, LLC, Colorado Springs, CO (US)

( * ) Notice: Subject to any disclaimer, the term of this patent is extended or adjusted under 35 U.S.C. 154(b) by 0 days.

(21) Appl. No.: 14/937,735

(22) Filed: Nov. 10, 2015

(65) Prior Publication Data
US 2016/0163978 A1    Jun. 9, 2016

Related U.S. Application Data

(60) Provisional application No. 62/089,518, filed on Dec. 9, 2014.

(51) Int. Cl.
*H01L 45/00* (2006.01)

(52) U.S. Cl.
CPC ............ *H01L 45/147* (2013.01); *H01L 45/04* (2013.01); *H01L 45/1233* (2013.01); *H01L 45/146* (2013.01); *H01L 45/1608* (2013.01)

(58) Field of Classification Search
CPC ............ H01L 45/1253; H01L 45/1608; H01L 45/147; H01L 45/1616
USPC .......................................................... 257/4
See application file for complete search history.

(56) References Cited

U.S. PATENT DOCUMENTS

| 6,624,463 | B2 | 9/2003  | Kim et al.         |
|-----------|----|---------|--------------------|
| 6,841,833 | B2 | 1/2005  | Hsu et al.         |
| 6,903,361 | B2 | 6/2005  | Gilton             |
| 7,038,935 | B2 | 5/2006  | Rinerson et al.    |
| 7,639,523 | B2 | 12/2009 | Celinska et al.    |
| 7,778,063 | B2 | 8/2010  | Brubaker et al.    |
| 7,834,338 | B2 | 11/2010 | Herner             |
| 7,872,900 | B2 | 1/2011  | Paz de Araujo et al. |

(Continued)

OTHER PUBLICATIONS

International Search Report in co-pending PCT Application No. PCT/US2015/059994 dated Mar. 4, 2016 (5 pages).
Choi et al.; "Resistive Switching Mechanisms of TiO2 Thin Films Grown by Atomic-Layer Deposition," Journal of Applied Physics 98, 033715(2005).

(Continued)

*Primary Examiner* — Fernando L Toledo
*Assistant Examiner* — Adam S Bowen
(74) *Attorney, Agent, or Firm* — Haynes and Boone, LLP

(57) ABSTRACT

A resistive switching memory comprising a first electrode and a second electrode; an active resistive switching region between the first electrode and the second electrode, the resistive switching region comprising a transition metal oxide and a dopant comprising a ligand, the dopant having a first concentration; a first buffer region between the first electrode and the resistive switching material, the first buffer region comprising the transition metal oxide and the dopant, wherein the dopant has a second concentration that is greater than the first concentration. In one embodiment, the second concentration is twice the first concentration. In one embodiment, the first buffer region is thicker than the active resistive switching region.

21 Claims, 10 Drawing Sheets

(56) References Cited

U.S. PATENT DOCUMENTS

| | | | |
|---|---|---|---|
| 2007/0045704 A1 | 3/2007 | Ufert | |
| 2008/0106925 A1 | 5/2008 | Paz de Araujo et al. | |
| 2008/0107801 A1* | 5/2008 | Celinska | H01L 45/04 427/96.7 |
| 2009/0026434 A1 | 1/2009 | Malhotra et al. | |
| 2010/0258781 A1 | 10/2010 | Phatak et al. | |
| 2013/0028003 A1* | 1/2013 | Wang | G11C 13/0007 365/148 |
| 2013/0207105 A1 | 8/2013 | Miller et al. | |
| 2013/0334484 A1 | 12/2013 | Wang et al. | |
| 2014/0225053 A1* | 8/2014 | Fujii | H01L 45/08 257/2 |
| 2014/0264223 A1* | 9/2014 | Tendulkar | H01L 45/147 257/2 |
| 2016/0087196 A1* | 3/2016 | Rupp | H01L 45/04 257/4 |

OTHER PUBLICATIONS

Inone et al.; "Nonpolar Resistance Switching of Metal/Binary-Transition-Metal Oxides/Metal Sandwiches Homogeneous/inhomogeneous Transition of Current Distribution," arXiv:Cond-mat/0702564 v.1 Feb. 26, 2007.

Lai, Stefan; "Current Status of the Phase Change Memory and Its Future," Intel Corporation, Research note RN2-05 (2003).

Park et al.; "Reproducible Resistive Switching in Nonstoichiometric Nickel Oxide Films Grown by RF Reactive Sputtering for Resistive Random Access Memory Applications," J. Vac. Sci. Technol. A 23(5), Sep./Oct. 2005.

\* cited by examiner

Transfer Doping $X(CO)_n + (TMO + CO)$  (Line 1)

- $X = Pd, Ta, Nb, ...$  (Line 2)

→ $W(CO)_6NiO/NiO/W(CO)_6NiO$  (Line 3)

→ $W(CO)_6YTiO_3/NiO/W(CO)_6YTiO_3$  (Line 4)

→ $W(CO)_6NiO/YTiO_3/W(CO)_6NiO$  (Line 5)

n is greater than 1

FIG. 10

Multilayered Structures with Ni:W(CO)$_6$

Wafers ran:
1. NiO/NiO:W/NiO      (3/3/3)     750A
2. NiO:W/NiO/NiO:W      (3/3/3)     <750A A, B, C, and D
         A - no recovery anneal
         B - furnace RA @ 450C
         C - RTA RA @ 450C
         D - RTA RA @ 650C Testing Summary:
Conduction mechanism control through NiO:W(CO)$_6$ 1A     Effect of active layer doping with W(CO)
- Initially ON, low resistance short ≥ 15x15μm$^2$
- High I$_{off}$, compliance current 1mA for 5x5
- V$_{set}$ ~1.4V, low dispersion, stable cycling 2A     Effect of buffer layers doping with W(CO)
- More conductive, low resistance short ≥ 7.5 (I$_{initial}$ 70mA for 5x5μm$^2$)
- Higher I$_{off}$, compliance current 2mA for 5x5
- V$_{set}$ ~1.6V, higher V$_{set}$ and V$_{reset}$ dispersion

2 more conductive than 1
A more conductive than B, C, D

TRANSITION METAL OXIDE RESISTIVE SWITCHING DEVICE WITH DOPED BUFFER REGION

CROSS-REFERENCE TO RELATED APPLICATIONS

This application claims the benefit of U.S. Provisional Application No. 62/089,518 filed Dec. 9, 2014, and is hereby incorporated by reference to the same extent as though fully contained herein.

BACKGROUND

1. Field

Embodiments of the switching devices described herein relate to integrated circuit memories and, in particular, to the formation of non-volatile integrated circuit memories containing materials which exhibit a change in resistance.

2. Statement of the Problem

Non-volatile memories are a class of integrated circuits in which the memory cell or element does not lose its state after the power supplied to the device is turned off. Resistance switching memories are memories in which the active element is a material that changes its state between resistive and conducting states. Many different resistance switching memories have been proposed. See Stephan Lai, "Current Status of the Phase Change Memory and Its Future," Intel Corporation, *Research note RN*2-05 (2005); U.S. Pat. No. 7,038,935 issued to Darrell Rinerson et al., on May 2, 2006; U.S. Pat. No. 6,903,361 issued to Terry L. Gilton on Jun. 7, 2005; U.S. Pat. No. 6,841,833 issued to Sheng Teng Hsu et al., on Jan. 11, 2005; U.S. Pat. No. 6,624,463 issued to Hyun-Tak Kim et al. on Sep. 23, 2003; B. J. Choi et al., "Resistive Switching Mechanisms of $TiO_2$ Thin Films Grown By Atomic-Layer Deposition," *Journal of Applied Physics* 98, 033715(2005); Jae-Wan Park et al., "Reproducible Resistive Switching In Nonstoichiometric Nickel Oxide Films Grown By RF Reactive Sputtering For Resistive Random Access Memory Applications," *J. Vac. Sci. Technol. A* 23(5), September/October 2005; I. H. Inone et al., "Nonpolar Resistance Switching Of Metal/Binary-Transition-Metal Oxides/Metal Sandwiches Homogeneous/Inhomogeneous Transition of Current Distribution," arXiv:Cond-mat/0702564 v.1 26, Feb. 2007; and U.S. Pat. No. 7,834,338 issued to S. Brad Herner on Nov. 16, 2010. None of these papers disclose a resistive switching element that is stable under normal voltage, currents, time, and temperatures at which non-volatile memories must operate.

A more stable memory is disclosed in U.S. Pat. No. 7,639,523 entitled "Stabilized Resistive Switching Memory" issued Dec. 29, 2009, to Jolanta Celinska, Mathew D. Brubaker, and Carlos A. Paz de Araujo; U.S. Pat. No. 7,872,900 entitled "Correlated Electron Memory" issued Jan. 18, 2011, to Carlos A. Paz de Araujo, Jolanta Celinska, and Mathew D. Brubaker; and U.S. Pat. No. 7,778,063 entitled "Non-Volatile Resistance Switching Memories And Methods Of Making Same" issued Aug. 17, 2010, to Mathew D. Brubaker Carlos A. Paz de Araujo, and Jolanta Celinska. The disclosures of the three foregoing patents, i.e., the U.S. Pat. No. 7,639,523, the U.S. Pat. No. 7,872,900 patent, and the U.S. Pat. No. 7,778,063 patent, are incorporated herein by reference to the same extent as though the patent disclosures were included identically herein. While these memories are stable, many examples of such memories use elements not normally used in complementary metal-oxide-semiconductor (CMOS) memories, such as platinum electrodes. Since many integrated circuit manufacturing facilities utilize CMOS manufacturing processes, it is more difficult to commercialize these memories. Further, commercial memory manufacturers many times have their preferred materials for electrodes, metallization, etc. Thus, it would be highly desirable to have a CeRAM non-volatile resistive switching memory and a process for making such a memory that was compatible with many different manufacturing processes, including CMOS technologies.

SUMMARY

In embodiments, a resistive switching memory includes a first electrode and a second electrode; an active resistive switching region between the first electrode and the second electrode, the resistive switching region including a transition metal oxide and a dopant including a ligand, the dopant having a first concentration; and a first buffer region between the first electrode and the resistive switching material, the first buffer region including the transition metal oxide and the dopant, wherein the dopant has a second concentration that is greater than the first concentration. In one alternative, the second concentration may be two times or more than the first concentration. In another alternative, the first buffer region may be thicker than the active resistive switching region. In yet another alternative, the first buffer region may be at least 1.5 times as thick as the active resistive switching region. Optionally, the memory may further include a second buffer region between the second electrode and the resistive switching region. Alternatively, the dopant may comprise a ligand. Alternatively, the ligand may comprise carbon, including compounds of carbon. In another alternative, the active resistive switching region may be 40 nanometers thick or less. Optionally, the active resistive switching region may be 30 nanometers thick or less. Alternatively, the active resistive switching region may be 20 nanometers thick or less. Optionally, the active resistive switching region may be 10 nanometers thick or less.

In embodiments, a method of making a resistive switching memory includes forming a first electrode and a second electrode; forming an active resistive switching region between the first electrode and the second electrode, the resistive switching region including a transition metal oxide and a dopant including a ligand, the dopant having a first concentration; and forming a first buffer region between the first electrode and the resistive switching material, the first buffer region including the transition metal oxide and the dopant, wherein the dopant has a second concentration that is greater than the first concentration. In one alternative, the forming of the first buffer region may comprise deposition of a precursor containing the transition metal and the dopant. In another alternative, the precursor may be a liquid precursor or a solid precursor, such as $W(CO)_6$. Alternatively, the deposition may be selected from MOCVD, spin on, dipping, liquid source misted deposition, sublimation, and atomic layer deposition (ALD). If a solid precursor is used, it may be deposited by sublimation. Optionally, the precursor may include 0.2 mol or less of the dopant. Alternatively, the precursor may include 0.1 mol or less of the dopant. Embodiments of the method may further include forming a second buffer region between the second electrode and the resistive switching region. The method may be included in a complementary metal-oxide-semiconductor (CMOS) process.

Embodiments also include a resistive switching element of the perovskite-type structure, such as $RAO_x$ where A includes Ni, Ti, and/or other transition metals; and R includes Y, La, Yb, Pr, Nd, and/or other rare earth elements. The resistive switching element further may include a ligand such as CO and carbonyls which stabilize valence states in coordination compounds of transition metals. The resistive switching element may further include multiple layers of different thickness and different transition metal complexes and the CO ligands.

In other embodiments, a resistive switching element includes a homojunction or heterojunction having various ratios of conductive to active layers thicknesses. The homojunction may include an active region of $YTiO_x$ sandwiched between a first region of supersaturated or conducting NiO and a second region of supersaturated or conducting NiO. The heterojunction may include an active region of $YTiO_x$ sandwiched between a first region of a supersaturated NiO and a second region of supersaturated NiO. Herein, supersaturated NiO means heavily doped NiO or other transition metal oxide in which the dopant is the extrinsic ligand CO—the carbonyl radical—or carbon elates of transition metals in the oxide. The ligand may be other ligands such as ammonia, sulfides, fluorides, nitosyl complexes, selenium complexes, and similar complexes.

Embodiments of the memory described herein not only provide a resistive switching memory that is stable under normal voltage, currents, time, and temperatures at which non-volatile memories must operate, but they also provide such a memory that can be manufactured under conventional integrated circuit manufacturing processes, such as CMOS processes. Further, embodiments of the memory are a purely quantum mechanical memory, as the transition between the conducting and resistive states is quantum mechanical. Numerous other features, objects, and advantages of the invention will become apparent from the following description when read in conjunction with the accompanying drawings.

BRIEF DESCRIPTION OF THE DRAWINGS

The above-mentioned features will become more clearly understood from the following detailed description read together with the drawings in which:

FIG. 10 illustrates embodiments of several multilayered device structures with NI:W(CO)$_6$, in which the material after the colon shows the material with which the Ni is doped, in this case tungsten hexacarbonyl, that is, tungsten with six carbonyls;

Figure 15:
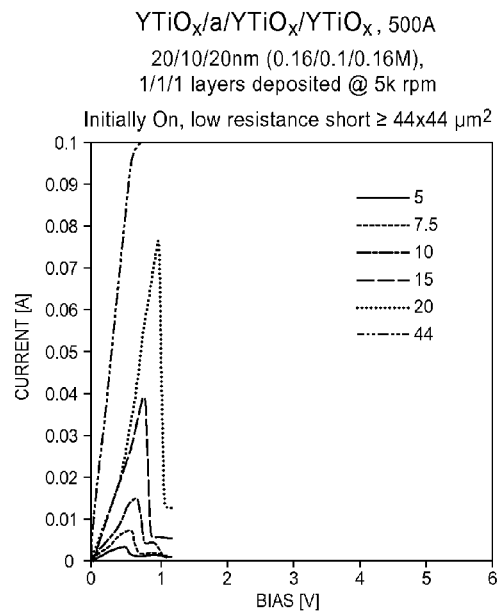
FIGS. 15 through 18 show results for a variety of measurements for a variety of different three-layer structures.
Figure 16:
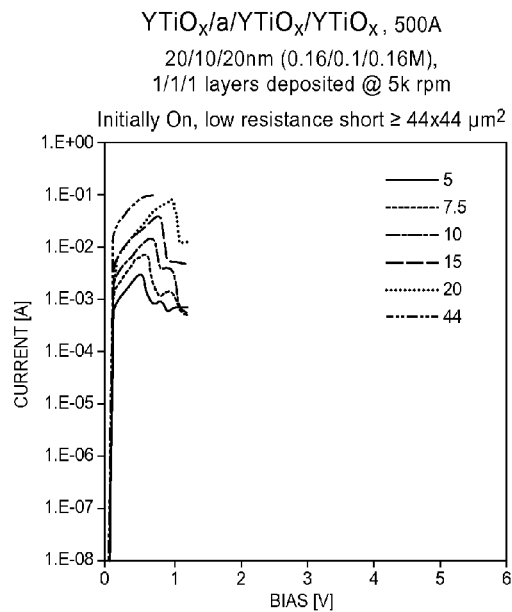

One skilled in the art who has read this disclosure while following along with the above figures will understand these results as the notations used are similar to the notations used for the above figures; however, one notation that is new is shown in FIGS. 15 and 16, which notation is an "a" between two slashes as in $YTiO_x/a/YTiO_x/YTiO_x$, which notation indicates that an anneal was performed between depositing the two layers on either side of the "a."

DETAILED DESCRIPTION

In recent years, much attention has been given to mesoscopic devices that exploit nanoscale phenomena which can be used for fast switching (in the femtosecond scale). This attention has been particularly acute for devices that show bi-stable nonvolatile memory states. Embodiments of the structures, systems, and methods described herein provide a framework that combines modeling and computation of the switching phenomena. The underlying physics disclosed herein advances the non-volatile memory field into the so-called complementary metal-oxide-semiconductor (CMOS) and beyond FLASH nonvolatile memory. A better understanding of the novel approach of active regions in a device where quantum phase transitions can occur in a controlled manner also is provided. This ability to technologically designate active regions where fast switching and memory action can occur in thicknesses around 5 nm is a novel feature of the invention. By employing techniques of stabilizing formal valence states in coordination compounds of transition metal oxides (TMO), a controllable specially defined region "doped" by substitutional ligands, such as carbonyl, can be created; and the switching and memory phenomena in metal/insulator transitions can be controlled at a nanoscale level without the current "filaments" paradigm of prior art resistive memories. This purely Mott or Charge Transfer quantum phase transition driven by voltage (energy) when isolated into specially controlled regions away from metal contacts creates a memory switching function that may be seen as purely a result of charge disproportionation reactions of the type that were theoretically predicted by Mott.

Embodiments of the structures, systems, and methods described herein create an area of rich new phenomena that are immediately useful and technologically significant. As the inventors reduced the scale of these devices, several things happened which have been theorized in the mesoscopic transport literature. Phenomena such as level discretization of the energy bands, bandwidth modulation, and transmission through an interacting electron region, though predicted theoretically, have never become an industry tool because devices that used these phenomena were not available. It is useful to understand the relationships of the Mott-like transition regions in these novel devices as compared to prior art semiconductor devices. As with the prior art semiconductor industry, isolation of an active region is fundamental for reliable device operation. Isolation of many body phase regions is a fundamental physics step in resistive memories, just as it was important in the first pn junctions in semiconductors (or metal/semiconductor and MOS junctions). In simple terms, the ability to have permanently conducting regions of doped materials next to reversible regions with Mott-like phenomena provide a new technological solution and, at the same time, a laboratory where many experiments of computational value can be performed.

Embodiments of the systems described herein provide a transition metal monoxide NiO, which is easily controlled by the technologically important step of doping with $Ni(CO)_4$. Devices made with introduction of this ligand introduction in the basic NiO can be made either fully conducting or able to sustain a metal/insulator transition. Simple sandwiches of metal/conducting NiO/active switching region (conductive or non-conducting NiO)/conducting NiO/metal with the NiO regions of thickness 30 nm/5 nm/30 nm show superb control of energy window (0.6 eV/1.2 eV), inducing electron density phase transitions in the metal to insulator side (0.6 eV) and a ballistic mesoscopic transport in the insulator to metal side. Also, the lack of direct interaction with the metal diminishes and even appears to completely screen space charge regions in the oxide/metal interface; i.e., such regions are screened by the conducting NiO. Experimental evidence clearly shows that these interfaces are ohmic and, when the active region is set in the insulator state, charge fluctuations are eliminated, thus allowing the active region to freely go through a phase transition.

The basis of the triggering mechanism of the phase transition may be thermionic injection into the active region from the conductive NiO region. Higher coherence of electron wave functions occurs when the thermal barrier is responsible. Thus, the 1.2 eV barrier, when overcome, induces ballistic transport with the ubiquitous gating effect given by the density driven phase transition in the active region. As the phase transition is much faster than the drift velocities of the charges injected from the cathode side, the anode local electron density triggers the critical occupation number in each 3D orbitals that acquire a repulsive Hubbard U (coulomb repulsion). With such an intra-site coulombic repulsion, a band gap opens, and in the case of NiO, as a charge transfer type of Mott insulator, a charge gap smaller than U becomes the predominant barrier, which barrier involves 3D (NiO)-2p (oxygen) interactions. Reversible and reliable femtosecond scale memory devices which have enormous technology value thus are realized.

The value for physics is that this is not unique to NiO. In fact, spin, spin/orbital coupling, and other phenomena in transition metal oxides, perovskites, and superconductors can be understood at the mesoscopic and nano scales using this artifact of spatially isolated phases. All solid state electronics work on the basis of switches which are metastable and memory that should be stable and reversible in at least two states. Hysteresis in general, when completely stable at zero bias against temperature fluctuations, is the basis of all nonvolatile memory. In the case of current FLASH memory, an artificial hysteresis due to charge trapping and trapping has found its limit as the charge storage becomes extremely small and the number of electrons in the floating gate gets to be below 100.

Answers to such a problem included ferroelectric and ferromagnetic hysteretic based memories. The incompatibility of materials and process temperatures now has pushed the industry to exploit these transition metal oxides in their resistive hysteresis. In our particular and unique case, the hysteresis does not come from filament formation due to soft breakdown of the insulator. It is a purposely physically driven control of the Mott-like phase transition. Demonstration of this phase transition from 4K to 150° C. has been shown. Also, in the memory states at zero bias, retention at 300° C. has been established.

We have shown that the action of the external ligand, such as the carbonyl ligand, may be common to all transition metals. Other ligands also are effective. A list of over one hundred ligands was disclosed in U.S. Pat. Nos. 7,639,523 and 7,872,900, which list is incorporated by reference herein. The transition metals mostly discussed herein are nickel and vanadium. Other transition metals with their ligands are included in the lists just mentioned. However, any transition metal may be used. Further, the foregoing patents also disclosed that the metal to insulator phase transition also can occur in compounds made by combining transition metals with materials of systems such as sulfides, iodides and tellurides. By extension, this also applies to combining transition metals with compounds of selenium, which lies between tellurium and sulfur and has similar properties. Examples of such materials are chalcogenides that include transition metals in combination with a ligand containing carbon. As one example, monochalcogenides have the formula TME, where TM is a transition metal and E is sulfur (S), iodine (I), tellurium (Te) and selenium (Se), in combination with CO, which may be written TME:CO. This can be synthesized by combining a monochalcogenide precursor with a transition metal carbonyl precursor, i.e., $TME+TM_x(CO)_y$. Another example are the dichalcogenides having the formula $TME_2$, which may be formed by combining the $TME_2$ with a related metal carbonyl, such as in $NiS_2+Ni(CO)_4$. This inclusion of carbonyls in the material will work with any chalcogenide that includes a transition metal. There are literally hundreds, if not thousands, of such materials, and hundreds of possible ligands as mentioned above, and to follow that direction in detail would expand this disclosure beyond the intended bounds herein. Let it suffice to say that the buffer layer concept disclosed herein should apply to all of them.

The disclosure that the chalcogenides that include transition metals can be converted to CeRAM materials by the simple inclusion of an external ligand, such as carbon or carbonyls, in their production will have significant impact on phase change memory (PCM) research. Certain properties of PCMs may have caused this research to veer in interesting but non-productive directions. As one example, the application of high electric fields to PCMs can suddenly turn high resistance glasses into excellent conductors, via the production of metal filaments. This probably is due to the fact that the metals in these materials simply melt along the path of the electric field to form the filaments. However, the filament formation has an element of randomness, is highly local, and the filaments are not stable. In contrast, the addition of an external ligand, such as carbon and carbonyls, creates a stable disproportionation condition that is uniform throughout the material.

The disproportionation that results in stable CeRAM materials can best occur when the coordination sphere is stabilized and away from defects and space charge regions. The present disclosure realizes this goal. As competition worldwide for resistive memories enters a decade of effort, we are now able to transfer to industry a fully CMOS-compatible NiO device. This is important, as all semiconductor devices below 65 nm now use nickel silicides which can take only 450° C. processing temperatures. Since the NiO device described herein can be synthesized at 400° C., it is already compatible with nanoscale CMOS.

Reference will now be made to specific embodiments of the structures, systems, and methods described in the following. It is understood that no limitation to the scope of the structures, systems, and methods is intended. It is further understood that the disclosed embodiments of the structures, systems, and methods include alterations and modifications to the illustrated embodiments and include further applications of the principles described herein as would normally occur to one skilled in the art.

Figure 1:
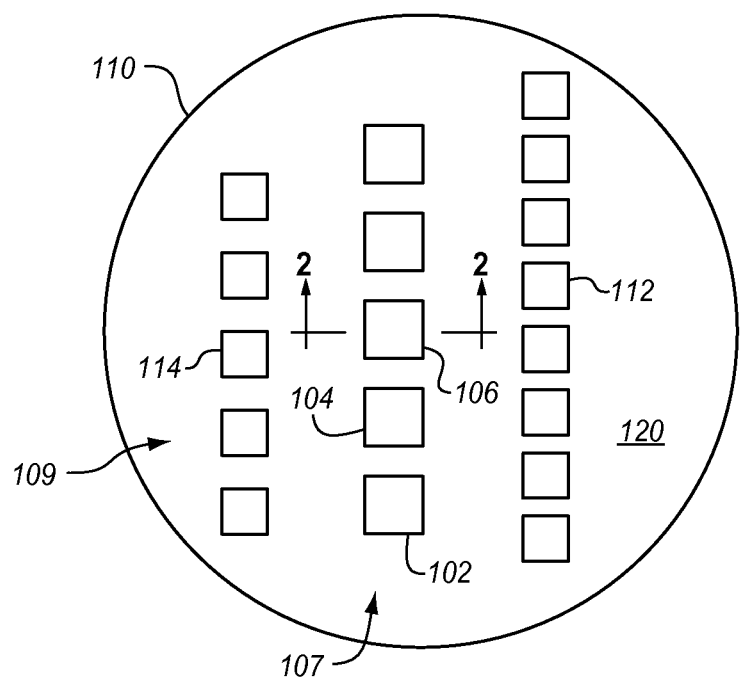
FIG. 1 depicts one embodiment of an integrated circuit having a plurality of memory units.

FIG. 1 depicts an exemplary integrated circuit 110 having a plurality of memory units 102, 104, and 106, preferably arranged in rows, such as 109 and columns, such as 107. Integrated circuit 110 also may include other integrated architectural structures 112, 114. The architectural structures, such as memory units 102, etc., and other structures 112, 114, preferably are formed on a semiconducting substrate 120, which preferably is silicon, but may be other materials such as germanium or gallium.

Figure 2:
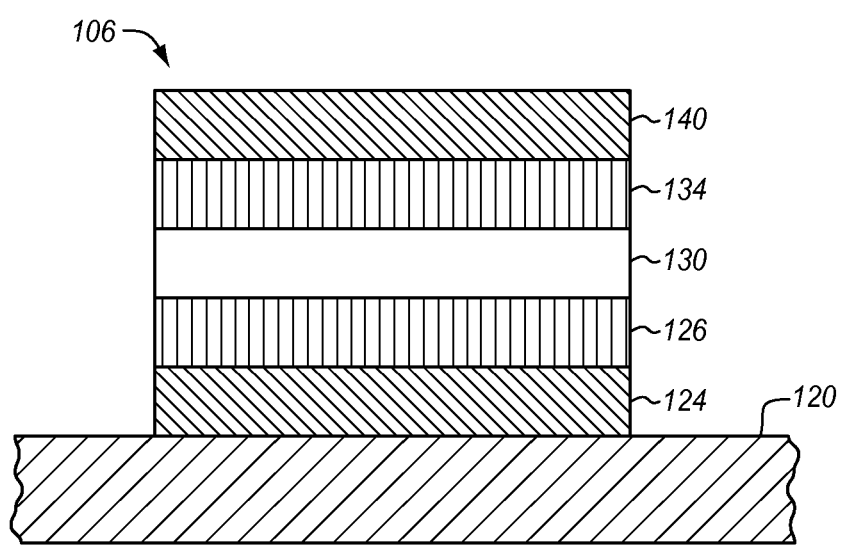
FIG. 2 is a cross-sectional view of a memory unit of the integrated circuit of FIG. 1 through the line 2-2.

FIG. 2 is a cross-sectional view of a memory unit 106 taken through the line 2-2 of FIG. 1. Memory unit 106 includes semiconductor 120, bottom electrode 124, buffer region 126, resistance switching active region 130, buffer region 134, and top electrode 140. Preferably, electrodes 124 and 140 are a conductive material, such as a metal or doped polysilicon. Examples of metals that may be used include platinum, aluminum, and titanium. Active region 130 is a transition metal oxide, such as nickel oxide or yttrium titanium oxide. Preferably, active region 130 is a CeRAM material which is a transition metal oxide doped with one or more extrinsic ligands that stabilize the CeRAM material. As known in the art, transition metal oxides include an intrinsic ligand, namely oxygen. An extrinsic ligand is an element or compound other than oxygen that participates in the coordination sphere of the transition metal ion.

Preferably, the stabilization is via a direct metal-extrinsic ligand bond, though the bond of the extrinsic ligand may also be with an intrinsic ligand. Carbon is an example of an extrinsic ligand element, and ammonia is an example of an extrinsic ligand compound. Additional details of the extrinsic ligand are disclosed in U.S. Pat. No. 7,639,523 entitled "Stabilized Resistive Switching Memory" issued Dec. 29, 2009, to Jolanta Celinska, Mathew D. Brubaker, and Carlos A. Paz de Araujo. Buffer regions 126 and 134 also are CeRAM materials, preferably the same material as active region 130, except more heavily doped. For example, region 130 may be doped with a 0.1 molar amount of extrinsic ligand material, e.g., carbon, while regions 126 and 134 are doped with a 0.2 molar amount of the extrinsic ligand material. Regions 126 and 134 may have different amounts of dopant, or the same amount of dopant. In some embodiments, only one of regions 126 and 134 is present, while in other embodiments both are present. While the regions 124, 126, 130, 134, and 140 are shown as having approximately the same thickness, preferably they each are of different thickness.

Figure 3:
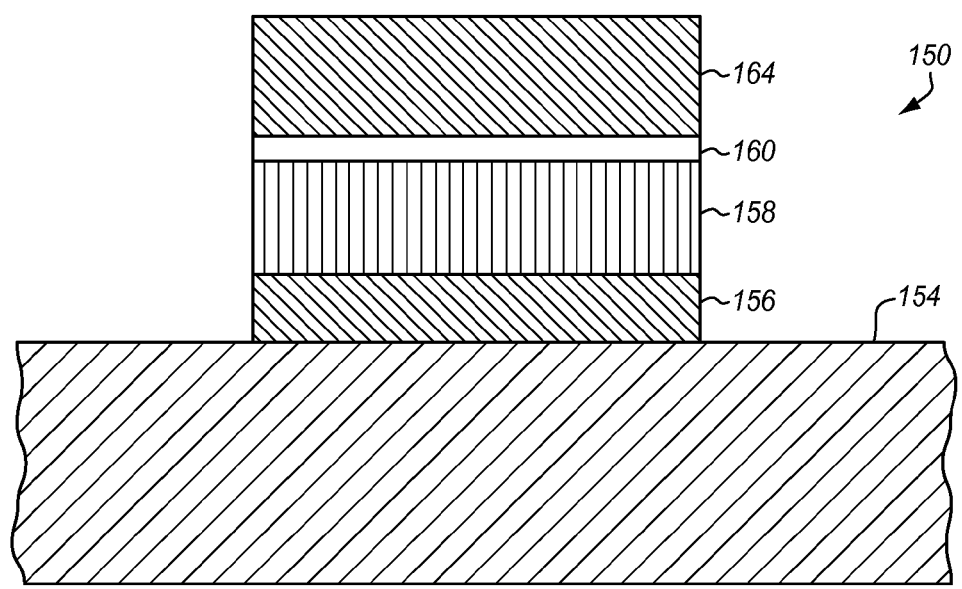
FIG. 3 is an illustration of one embodiment of a memory unit.

FIG. 3 is an illustration of one embodiment of a memory unit 150. Memory unit 150 includes semiconductor substrate 154, preferably a semiconductor wafer, bottom electrode 154, top electrode 164, resistive switching active region 160, and buffer region 158. This particular embodiment is meant to illustrate one exemplary embodiment of a memory unit with a single buffer region as well as the relative thicknesses of the regions 160 and 158. In this embodiment, region 158 is a relatively thick region of high ligand molarity material, in this case carbon rich material, which material is preferably conductive. In this discussion, "rich" means relative to region 160. Region 160 illustrates a region of low ligand molarity material, in this case low carbon. Here, "low" means in relationship to region 158. In this particular embodiment, the ligand is carbon. Preferably, region 160 is relatively thin as compared to region 158. Preferably, electrodes 164 and 156 are a conductive material, such as a metal or doped polysilicon. Examples of metals that may be used include platinum, aluminum, and titanium. It should be recognized that FIGS. 1-3 and 8 herein do not depict actual integrated circuits or integrated circuit elements, and are not to scale, but rather, as known in the patent drawing art, merely are idealized illustrations to better explain the elements of the structures, systems, and methods. While the regions are shown as vertically stacked, the regions may also be in horizontal layers, or on other architectures. Electrical measurements taken on an actual memory unit 150 are discussed below.

To describe the resistive switching memory cells succinctly, such as 150, a descriptive notation will be used as described in the following. The memory cells are formed using spin-on deposition of a NiO plus ligand precursor followed by baking and then by rapid thermal annealing (RTA), preferably at 450° C. at a rate of 100 C/sec. Each spin-on layer is baked prior to forming the next region. The NiO plus ligand precursors used herein are such that, after annealing, one spin-on layer of the 0.2 molarity precursor generally is 10 nm thick and one spin-on layer of the 0.1 molarity precursor is 5 nm thick. Thus, if, for example, three layers of 0.2 molarity spin-on precursors are deposited, a region of total thickness of 30 nm will result; and if two layers of 0.1 molarity spin-on precursors are deposited, a region of total thickness of 10 nm will result. Referring to FIG. 2, the notation that has been developed designates the number of layers of the bottom buffer region 126 followed by the number of layers of the active region 130 followed by the number of layers of the top buffer region 134. The numbers are separated by "+" signs. The buffer regions may be made with 0.2 molarity precursor, while the active region may be made with the 0.1 molarity precursor. Thus, the notation NiO (6+2+3) indicates a memory unit having a bottom buffer region 126 made of six layers of 0.2 molarity precursor, which will be 60 nm thick, an active region 130 made of two layers of 0.1 molarity precursor, which will be 10 nm thick, and a top buffer region 134 made of three layers of 0.2 molarity precursor, which will be 30 nm thick. As another example, the notation NiO (3+1+2) would indicate a memory unit having a 30 nm thick bottom buffer region 126 made with three spin-on layers of 0.2 molarity precursors, a 0.5 nm thick active region 130 made with one spin-on layer of 0.1 molarity precursors, and a 20 nm thick buffer region 134 made with two spin-on layers of 0.2 molarity precursors.

Figure 4:
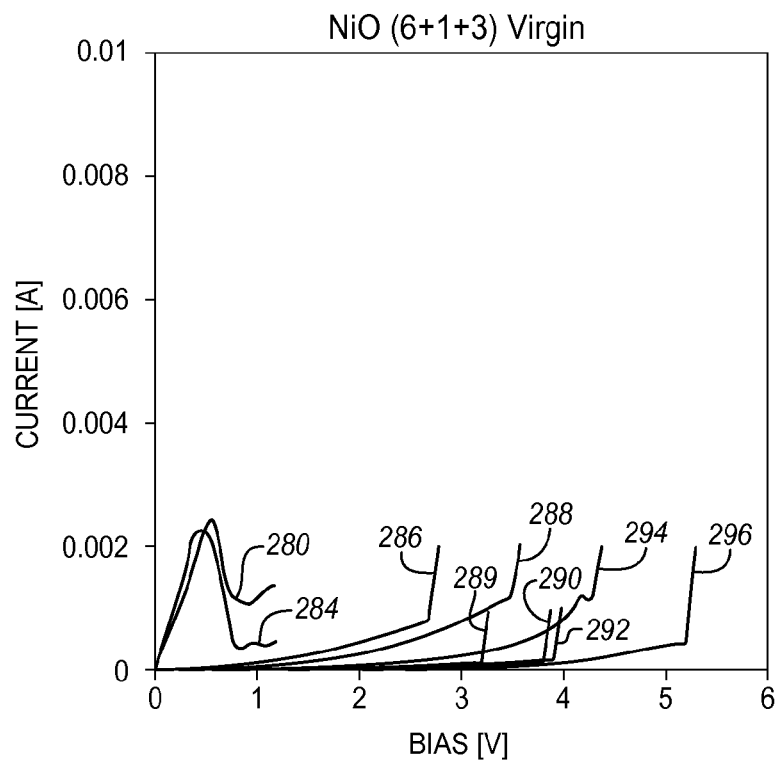
FIG. 4 is a graph of the current in amps, a function or bias voltage in volts for a NiO (6+1+3) memory unit as in FIG. 3, for nine different memory unit areas.

FIG. 4 is a graph of the current in amps as a function of bias voltage in volts for the initial sweeps for a NiO (6+1+3) memory unit as in FIG. 3 for nine different memory unit areas. This memory unit was the same as that which was measured in FIG. 5, except that the active switching region was only one spin-on region which, after annealing, was 5 nm thick. Curve 280 is the curve for a memory unit having an area of 222×222 µm2, curve 284 is for a memory unit having an area of 133×133 µm2, curve 286 is for a memory unit having an area of 89×89 µm2, curve 288 is for a memory unit having an area of 44×44 µm2, curve 292 is for a memory unit having an area of 20×20 µm2, curve 289 is for a memory unit having an area of 15×15 µm2, curve 290 is for a memory unit having an area of 10×10 µm2, curve 296 is for a memory unit having an area of 7.5×7.5 µm2, and curve 294 is for a memory unit having an area of 5×5 µm2. The results are similar for devices in which the active region is thicker, except the current is somewhat higher and the edge effects are less.

Figure 5:
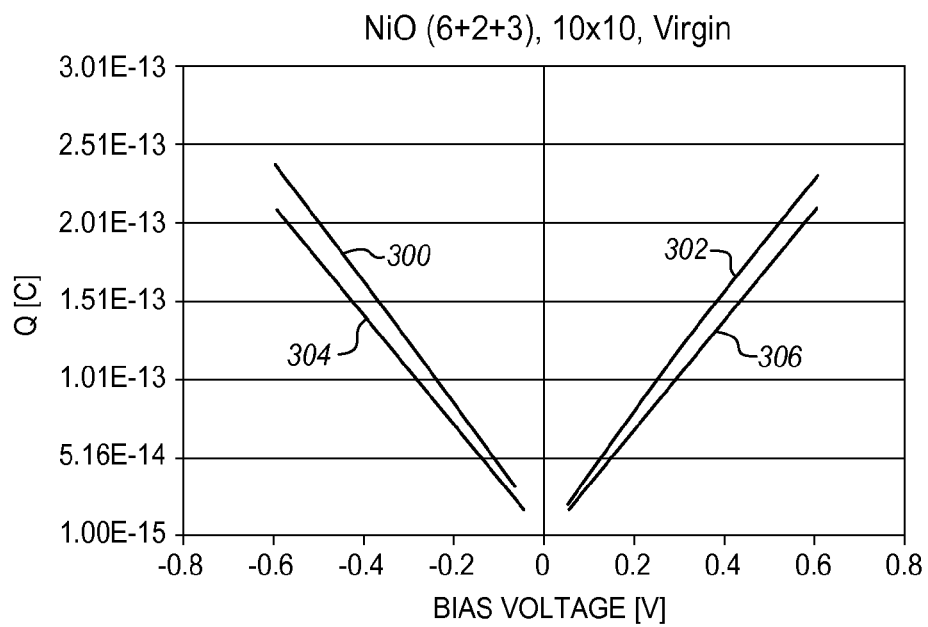
FIG. 5 shows graphs of charge in coulombs versus bias voltage at two different bias frequencies for a NiO (6+2+3) memory unit having an area of 10 micrometers×10 micrometers.

FIG. 5 shows graphs of charge in coulombs versus bias voltage for the first sweep at two different bias frequencies for a NiO (6+2+3) memory unit having an area of 10 micrometers×10 micrometers. The electrodes were platinum. Curves 300 and 302 were measured at 10 kiloHertz (kHz), and curves 304 and 306 were measured at 1 megaHertz (MHz). These curves show that the charge versus voltage is bi-stable and linear for both positive and negative voltages, which is an exceptional response for a memory.

Figure 6:
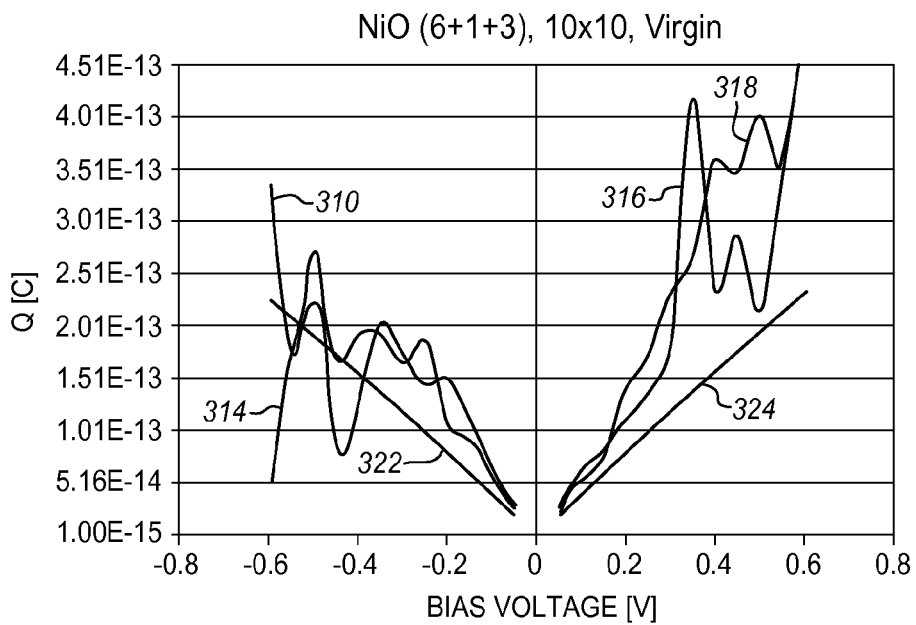
FIG. 6 shows graphs of charge in coulombs versus bias voltage in volts at two different bias frequencies for a NiO (6+1+3) memory unit having an area of 10×10 square micrometers.

FIG. 6 shows graphs of charge in coulombs versus bias voltage in volts at two different bias frequencies for a NiO (6+1+3) memory unit having an area of 10×10 square micrometers. The electrodes were platinum. Curves 310, 314, 316, and 318 were measured at 10 kiloHertz (kHz), and curves 322 and 324 were measured at 1 megaHertz (MHz). The results are similar to the results to those of FIG. 5 for the 1 MHz measurement, but the results for the 10 kHz measurement are non-linear. This is due to the fact that, at 10 kHz, the measuring equipment is showing the effects of the interfaces.

Figure 7:
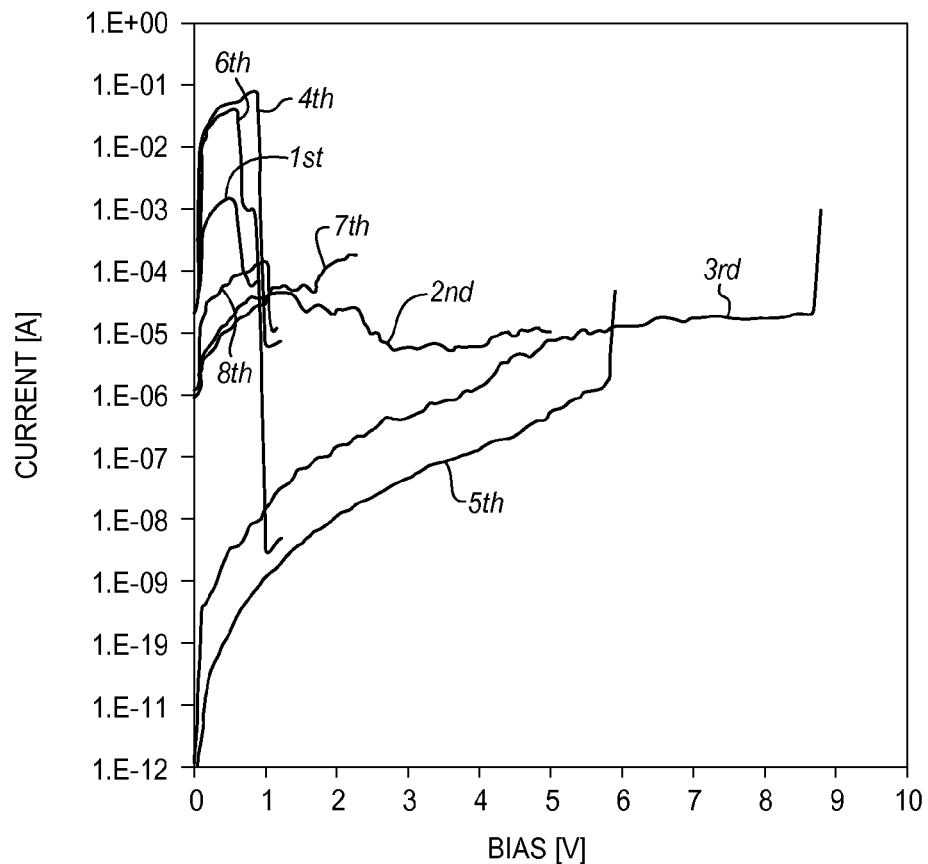
FIG. 7 is a graph of current in amps as the ordinate versus bias voltage in volts as the abscissa for first eight sweeps of a $YTiO_x$ memory unit, with no buffer regions (the ordinate is logarithmic)

FIG. 7 is a graph of current in amps versus bias voltage in volts for the first eight sweeps of a $YTiO_X$ 10×10 µm2 memory unit, with no buffer regions and platinum electrodes. The ordinate is logarithmic.

The thin films or the CeRAM material discussed herein are deposited via a liquid deposition process, preferably a process in which carbon is introduced into the material. These processes include MOCVD (metalorganic vapor phase epitaxy), spin on, dipping, liquid source misted deposition, atomic region deposition (ALD), other CSD (chemical solution deposition) methods, or by depositing a metal and then oxidizing it with a carbon donor compound present in the atmosphere. In the preferred methods, metalorganic precursors are deposited and reacted to form the desired material. Octane is the preferred solvent for the transition oxide precursors. The memory units according to the invention are made as follows. The substrate 120 may be a silicon wafer with a silicon oxide coating. The substrate may be baked to remove any moisture. Simultaneously, CeRAM precursors may be readied. The precursor contains metal moieties suitable for forming the variable resistance material upon deposition and heating. For example, if nickel oxide is the desired variable resistance material, then the precursor will contain nickel. The precursor may be a liquid containing carbon, and may be a metalorganic precursor. This may be an off-the-shelf precursor purchased from a chemical company, such as Kojundo Chemical Co. of Tokyo, Japan; or the precursor may be prepared just prior to deposition. The bottom electrode 124 is deposited, which electrode may include an adhesion region and/or a barrier region as known in the art. The electrode may be platinum. Then, the regions 124, 126, and 134 may be formed. To form each of these regions, a precursor may be deposited, which may be by spin-on deposition; but it may be deposited in other ways mentioned above. After depositing, the precursor may be heated to form a crystallized material. In one embodiment, the heating process comprises a bake process and an anneal process. However, a wide variety of heating processes may be used, including baking on a hot plate, furnace anneal, rapid thermal processing (RTP), sometimes called rapid thermal annealing (RTA), or any other process that will crystallize the film. The deposited precursor on the wafer may be baked, such as on a hot plate, and may be at a temperature between 100° C. and 300° C. for a time of between 1 minute and 10 minutes. Two bakes may be used at different temperatures; the second bake may be at the higher temperature. The deposition and bake steps may be repeated for as many times as required to obtain the desired thickness of films. After all of the layers are deposited and dried, the dried layers are annealed to form a crystallized film, such as 126, 130, or 134. The annealing may be at a temperature of from 450° C. to 650° C., for example, with the lower temperature, and for a time from 20 minutes to 1 hour. The anneal may be performed in oxygen or in a gas containing a desired ligand. Then, after all the CeRAM regions are formed, the top electrode 140 may be deposited. This may be platinum. The top electrode and CeRAM materials then are patterned, such as by a dry etch, for example, by ion milling with argon. A recovery anneal then may follow, which anneal may be at a temperature of from 450° C. to 650° C. and may be for a time from 30 minutes to 1.5 hours, and may be in oxygen. The integrated circuit then may be completed to include the CeRAM material 130 as an active element in an integrated circuit. Here, "active element" means an element that changes in response to the application of current or voltage, in contrast to, say, a passivation insulator.

The principles of the embodiments described herein also can be applied to other resistive switching materials, such as resistive switching elements of the perovskite-type structures such as RAOx where A comprises Ni, Ti . . . , and other transition metals; and R comprises La, Y, Pr, Nd, and other rare earth elements. The resistive switching element may further include a ligand such as CO and carbonyls which stabilize valence states in coordination compounds of transition metals. The resistive switching element may further comprise multiple layers of different thickness and different transition metal complexes and the CO ligands. The principles of the embodiments described herein may further be applied to resistive switching elements comprising a homojunction or heterojunction having various ratios of conductive to active layers thicknesses. The homojunction may comprise an active region of YTiOx sandwiched between a first region of supersaturated or conducting NiO and a second region of supersaturated or conduction NiO. The heterojunction may comprise an active region of YTiOx sandwiched between a first region of a supersaturated NiO and a second region of supersaturated NiO. Herein, supersaturated NiO means heavily doped NiO or other transition metal oxide in which the dopant is the extrinsic ligand CO, the carbonyl radical, or carbon states of transition metals in the oxide. The ligand may be other ligands such as ammonia, sulfides, fluorides, nitosyl complexes, selenium complexes, and similar complexes.

Figures 8, 9:
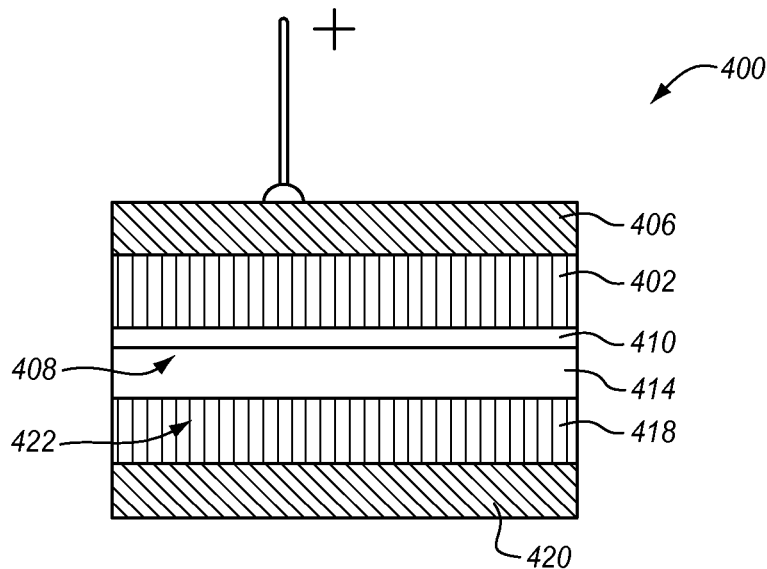
FIG. 8 illustrates one embodiment of a device structure for the CeRAM.
FIG. 9 illustrates several embodiments of the device structure that utilize transfer doping.

A structure useful for explaining some features of one CeRAM device 400 is shown in FIG. 8. In this example, the CeRAM device 400 includes three thin films —402, 414, and 418—of $Ni(CO)_4$ doped NiO nickel oxide between two outer metal conductors 406 and 420. The active material 414 is sandwiched between two films of NiO, 402 and 418, that serve as buffer electrodes or barrier layers. The two buffer films 406, 418 are doped so as to be very highly conducting and act as matching electrodes, while the central core active film 414 is nickel oxide with a different lower level of similar doping. In one embodiment, the buffer layer 402 is about 20 nanometers (nm) thick, the active layer 414 (which includes region 410) is about 10 to 20 nm thick, and the buffer layer 418 is about 20 nm thick, for a total thickness of the device between the electrodes 406 and 420 being about 60 nm thick. The barrier layers 402 and 422 play a number of important roles. They provide an ohmic contact to the active material and more importantly move any Shottky barrier-like effects caused by the outer electrodes and any unwanted surface states away from the active material electrode interface; surface states may impede that action of the device. The doped NiO barrier layers 402 and 418 are always conducting any screen electrode effects from the active layer 414. In operation, it is the central region 414 that undergoes the reversible Metal Insulator Transition (MIT) between conducting and insulating states, which quantum phase transition may begin in area 410 close to the anode. Localized single-site oxidation reduction events occur in region 408. Once transitioned, active region 414 is able to remain in either state as long as required, which ability is the basis of its potential use as a non-volatile (NV) memory. While in this paragraph and elsewhere the term "doping" may be used in a colloquial sense to describe a mechanism by which the NiO structure may be modified, it should be understood that the concentration levels may be higher than those associated with donor or acceptor doping in conventional single crystal silicon.

FIG. 9 shows examples of transfer doping. Transfer doping refers to the addition of a ligand, for example $(CO)_n$, via another transition metal compound having a ligand, such as the carbonyl unit (CO), which ligand has an n greater or equal to the extrinsic ligand, such as the carbonyl compound, of the host transition metal oxide. As shown in the first line of FIG. 9, a transition metal X combined with $(CO)_n$ can be used to provide extrinsic ligand material for a transition metal oxide, in this case TMO, for which the extrinsic ligand is CO. Since the extrinsic ligand has one oxygen, the transition metal that provides the transfer doping may have an n that is greater than one. The transition metal that provides the additional extrinsic ligand can be lead, tantalum, niobium, tungsten, or most any other transition metal. For example, we know that NiO is a host compound in which the intrinsic ligand is oxygen. The carbonyl compound for nickel is $Ni(CO)_4$. So, in this case, it is desirable to have more CO in the solution transfer doping which may be used. Here, "solution" means either the initial liquid solution or the solid solution after heat treatment or annealing.

The third line of FIG. 9 illustrates one use of transfer doping. Since the compound $Ni(CO)_4$ is extremely poisonous, in order to get more CO, it is preferable to add tungsten hexacarbonyl $[W(CO)_6]$ to the NiO using a carbon-based metalorganic solution or sublimation. This is realized using a buffer layer of $W(CO)_6NiO$, a switching layer of NiO (with extrinsic ligand CO), and another buffer layer of $W(CO)_6NiO$. As a result, the solid host after annealing has some carbon or carbonyl (CO) inside, and now has more carbonyl from the tungsten hexacarbonyl. While the tungsten, per se, may or may not add to the conductivity of the sample, the tungsten hexacarbonyl creates conductivity via transfer doping. In other words, the carbonyl carrying transition metal, added to the host, is almost inert with respect to the change in conductivity, while the six units of CO, due to back donation mechanism in which the CO donates an electron or more to Ni via a sigma bond directly to the metal, receives back two electrons via a 2-p bond between the metal and the oxygen orbitals with less energy than the nickel metal. In this process, the Fermi level, i.e., the highest occupied electronic level of the entire system, is lowered toward the "valence band" or, more precisely, the "lower Hubbard band," which makes NiO more p-type and a hole conductor. Thus, transfer doping is a way to make the host more p-type, which is useful for the reset operation of CeRAM.

This can be extended to multiple types of carbonyl-based compounds with different moieties or amounts in the same host and thus modulating the Fermi level almost independently of the sigma doping which is responsible for the required disproportionation reaction which causes the Mott switch to occur in response to the screening effect of the surrounding electron density. Such electron density, of course, is increased at SET and decreased at RESET voltages. As another example, the fourth line of FIG. 9 shows a formulation for a CeRAM device similar to that of line three with $YTiO_3$ substituted for the NiO in the buffer layers. Another variation is shown in the fifth line of FIG. 9 in which the buffer layers are the same as the example of line three, but the active layer is $YTiO_3$ instead of NiO.

Examples shown in FIG. 9 show NiO and $YTiO_x$ as the host oxide. However, any transition metal oxide (TMO) and perovskite (like $SrTiO_3$, etc.) can have $(CO)_x$ as a ligand. So we may have different layers with heterogeneous and homogeneous layers. For example, we can use $NiO/YTiO_3$ (with carbon)/NiO, and we also can put a neutral TMO like $W(CO)_6$, rich in (CO), thus rich in carbon, to make layers like $NiO(W(CO)_6)/YTiO_3$(with carbon)/$NiO(W(CO)_6)$, etc.

Similarly, we have found that rare earth (Re) materials can be utilized in a formulation such as line 1 of FIG. 9, where n is greater than one; that is, devices such as $ReTiO_3/ReTiO_3/ReTiO_3$, $ReNiO_3/ReNiO_3/ReNiO_3$, or $ReNiO_3/ReTiO_3/ReNiO_3$ and other such variations, where each layer has a different molarity and each layer includes a $(CO)_x$ ligand such as $(CO)_6$, have been made. Devices using $ReTiO_3$ and $ReNiO_3$, where Re may be Y, Sc, La, Pr, Yb, Eu, and other rare earths have been made. Here, we understand that Y, Yb, and Eu technically are not rare earths; but these materials are commonly included in listings of rare earths because these materials are often found with rare earths in deposits occurring in nature. Also, we have discovered switching in $PbNiO_x$ does not fall into any existing literature—a true new material. Thus, the material may be postulated as A(+2)NiO and also A(+2)TiO.

FIG. 10 compares several possible multilayered device structures with $NI:W(CO)_6$, in which the material after the colon shows the material with which the Ni is doped, in this case tungsten with six carbonyls; this notation will also be used below. FIG. 10 first shows two different but related structures, NiO/NiO:W/NiO which is numbered as structure 1, and NiO:W/NiO/NiO:W which is numbered as structure 2. In this figure, we have put the layer that includes the tungsten hexacarbonyl in bold to draw attention to the fact that, in the number 1 structure, the tungsten hexacarbonyl is in the switching layer; and in the number 2 structure, the tungsten hexacarbonyl is in the buffer layers. It is understood that each W includes $(CO)_6$ as an extrinsic ligand. Both the active layer (the middle layer) and the buffer layers are made with three spin-on layers as shown by the notation 3/3/3. It should be understood that the middle layer has lower molarity, as discussed above. The thickness of the number 1 devices was 750 angstroms, and the thickness of the number 2 devices was less than 750 angstroms. The number 1 and number 2 devices were made under conditions A, B, C, and D where A means on recovery anneal, B means furnace rapid anneal at 450° C., C means rapid thermal anneal (RTA) at 450° C.; and D means RTA at 650° C. The number 1 and number 2devices were tested to show conduction mechanism control through use of NiO:W(CO)$_6$. A wafer 1A in which the center, active layer was NiO doped with W(CO)$_6$ with no recovery anneal was initially ON and showed a low resistance short with areas less than 15×15 square micrometers. It also showed OFF, with the compliance current at 1 milliamp for a 5×5 square micrometers device. It had a V$_{set}$ pf about 1.4 volts, with low dispersion and stable cycling. A wafer 2A in which the center, active layer was NiO and the buffer layers were both NiO doped with W(CO)$_6$ with no recovery anneal proved to be more conductive, having a low resistance short for devices of areas greater than 7.5 micrometers squared. This device showed an initial current of 70 milliamps for devices of 5×5 square micrometers. It had a higher OFF, having a compliance current of 2 milliamps for the 5×5 square micrometers device. V$_{set}$ was about 1.6 volts, with higher V$_{set}$ and V$_{reset}$ dispersion. Overall, a number 2 device was more conductive than the number 1 device; and an A-type device was more conductive than the type B, C, and D devices.

FIGS. 11 through 18 show measurements made on integrated circuit devices according to the invention to illustrate properties of CeRAM devices. In these figures, the symbol W stands for tungsten hexacarbonyl.

Figure 11:
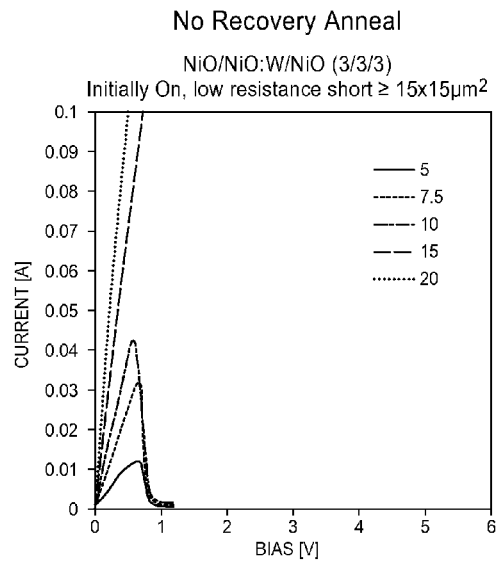
FIG. 11 shows the results of measurements of current in amps versus bias voltage in volts for a NiO:W structure with no recovery anneal.

FIG. 11 shows the results of measurements of current in amps versus bias voltage in volts for NiO/NiO:W/NiO structures of differing areas with each of the active and buffer layers being formed with three layers of spin-on and with no recovery anneal. All devices were initially ON and had low resistance shorts for areas greater than or equal to 15×15 square micrometers. In other words, it was not possible to reset the devices because they were too conductive. This is due to the 0.1 amp limitation of the testing device. If the testing device could operate at a higher amperage, the devices could be reset.

Figure 12:
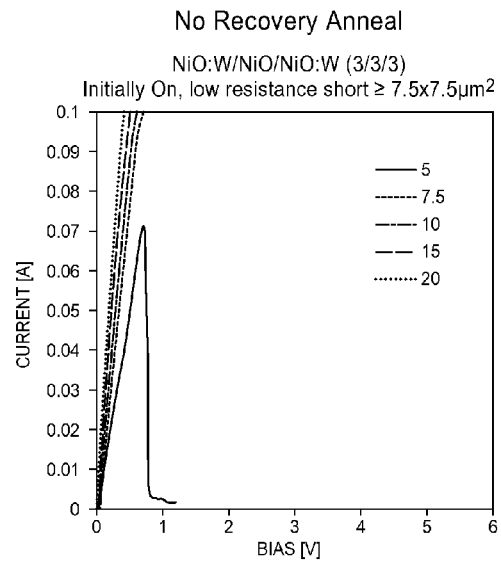
FIG. 12 shows the results of measurements of current in amps versus bias voltage in volts for an alternative NiO:W structure with no recovery anneal.

FIG. 12 shows the results of measurements of current in amps versus bias voltage in volts for an NiO:W/NiO/NiO:W structure with no recovery anneal, with each of the active and buffer layers being formed with three layers of spin-on. All devices initially were ON and had low resistance shorts for areas greater than or equal to 7.5×7.5 square micrometers. Comparing the curves of FIGS. 11 and 12, it is seen that the devices with the tungsten hexacarbonyl in the buffer layers were generally more conductive.

Figure 13:
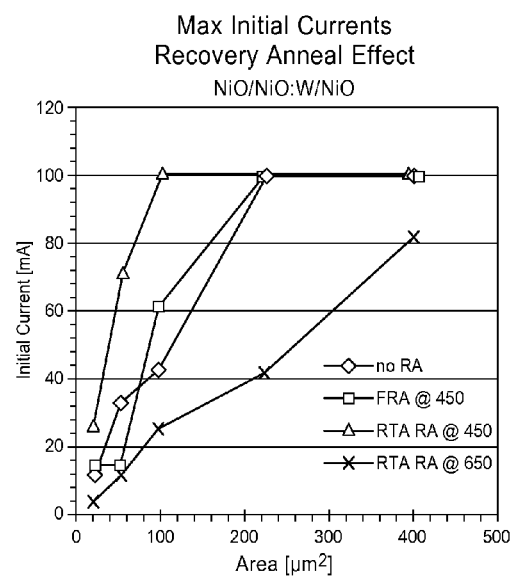
FIGS. 13 and 14 show the results of measurements of initial current in milliamps versus device area in square micrometers for several different device structures at different rapid anneal conditions.
Figure 14:
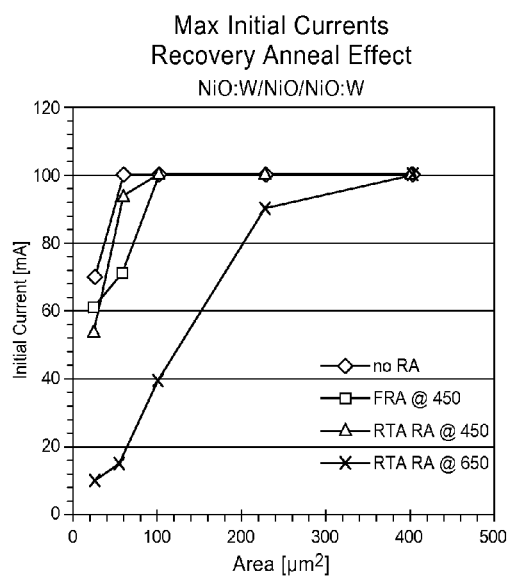

FIG. 13 show the results of measurements of initial current in milliamps versus device area in square micrometers for a NiO/NiO:W/NiO device at different rapid anneal conditions. In this figure, RA means recovery anneal, F RA means a furnace recovery anneal, and RTA means a rapid thermal anneal. As before, W stands for tungsten hexacarbonyl. FIG. 14 shows the results of measurements of initial current in milliamps versus device area in square micrometers for NiO:W/NiO/NiO:W device structures at the same different rapid anneal conditions mentioned above. Comparing FIGS. 13 and 14, we see that the results are similar, except that again the devices with the tungsten hexacarbonyl in the buffer layers were more conductive.

FIGS. 15 and 16 show results for measurements of the current in amps versus the bias voltage in volts for a variety of three-layer structures with differing areas; one skilled in the art who has read this disclosure while following along with the above figures will understand these results, as the notations used are similar to the notations used for the above figures; however, one notation that is new is an "a" between two slashes as in YTiO$_x$/a/YTiO$_x$/YTiO$_x$, which notation indicates that an anneal was performed between depositing the two layers on either side of the "a." Each layer is formed of YTiO$_x$ with carbonyl doping, though the carbonyl molarity of the middle layer is lower, i.e., 0.1 molarity as compared to 0.16 molarity for the buffer layers. The devices also were annealed at the end. The anneals were in a furnace at 450° C. for 30 minutes. The thickness of the devices was 500 angstroms. In FIG. 15, the ordinate is linear, while in FIG. 16 it is logarithmic. In these examples, all devices were initially ON and could be reset, except the devices greater than or equal to 44 square micrometers.

Figure 17:
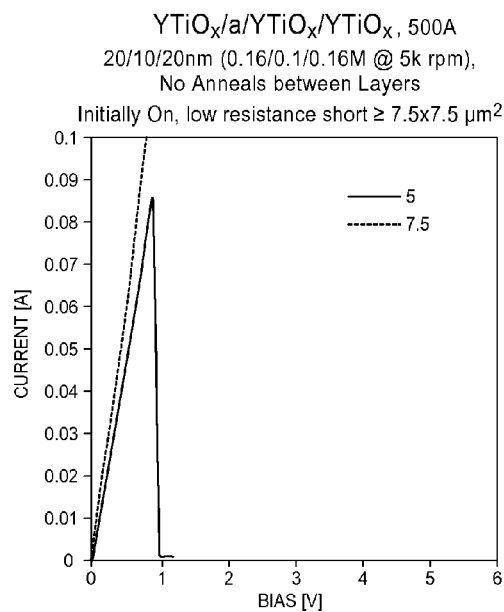
Figure 18:
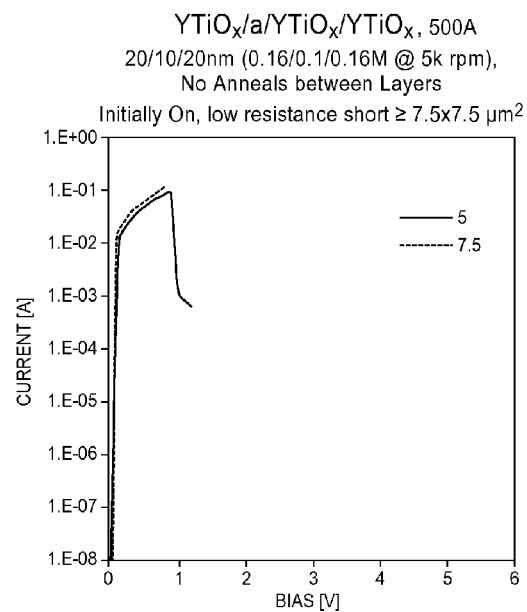

FIGS. 17 and 18 show results for measurements of the current in amps versus the bias voltage in volts for a variety of three-layer structures with differing areas. Each layer is formed of YTiO$_x$ with carbonyl doping, though the molarity of the middle layer is lower, i.e., 0.1 molarity as compared to 0.16 molarity for the buffer layers. In each case, the device initially is ON. Devices of greater than or equal to 7.5 square micrometers had a low resistance short. In FIG. 17, the ordinate is linear, while in FIG. 18, the ordinate is logarithmic.

Another discovery is that the material may be one that is p-type, so that holes create the conditions for the metal-to-insulator switch, versus the insulator-to-metal which is done by tunneling. Generally, all base oxides may be p-type in their natural state (which is true for all perovskites, even SBT, PZT, and other ferromagnetic materials). NiO is p-type, while Ta$_2$O$_5$ and HFO$_2$ are not. Therefore, this effect may not be found in these latter materials. The filling of bands with holes or electrons is fundamentally the rocking chair between two states. This suggests that we may make a TMO that is n-type to become p-type by doping; this may be a p-type material which can provide CeRAM switching.

There has been described a resistive switching memory with a large memory window and which is compatible with CMOS processing. It should be understood that the particular embodiments shown in the drawings and described within this specification are for purposes of example and should not be construed to unnecessarily limit the claims below. Further, it is evident that those skilled in the art may now make numerous uses and modifications of the specific embodiments described, without departing from the inventive concepts. It also is evident that the methods recited, in many instances, may be performed in a different order; or equivalent structures and processes may be substituted for the various structures and processes described. It is understood that each of the features and elements described herein can be combined with any of the other features and elements.

We claim:

1. A resistive switching memory comprising:
    a first electrode and a second electrode;
    an active resistive switching region between said first electrode and said second electrode, said resistive switching region comprising a transition metal oxide and a dopant comprising a ligand, said dopant having a first concentration; and
    a first buffer region between said first electrode and said resistive switching material, said first buffer region comprising said transition metal oxide and said dopant, wherein said dopant has a second concentration that is greater than said first concentration.

2. A resistive switching memory as in claim 1, wherein said second concentration is twice said first concentration.

3. A resistive switching memory as in claim 1, wherein said first buffer region is thicker than said active resistive switching region.

4. A resistive switching memory as in claim 3, wherein said first buffer region is at least 1.5 times as thick as said active resistive switching region.

5. A resistive switching memory as in claim 1, and further including a second buffer region between said second electrode and said resistive switching region.

6. A resistive switching memory as in claim 1, wherein said dopant comprises carbon or a carbon compound.

7. A resistive switching memory as in claim 1, wherein said active resistive switching region is no more than 40 nanometers thick.

8. A resistive switching memory as in claim 1, wherein said active resistive switching region is no more than 30 nanometers thick.

9. A resistive switching memory as in claim 1, wherein said active resistive switching region is no more than 20 nanometers thick.

10. A resistive switching memory as in claim 1, wherein said active resistive switching region is no more than 10 nanometers thick.

11. A method of making a resistive switching memory, said method comprising:
   forming a first electrode and a second electrode;
   forming an active resistive switching region between said first electrode and said second electrode, said resistive switching region comprising a transition metal oxide and a dopant comprising a ligand, said dopant having a first concentration; and
   forming a first buffer region between said first electrode and said resistive switching material, said first buffer region comprising said transition metal oxide and said dopant, wherein said dopant has a second concentration that is greater than said first concentration.

12. A method as in claim 11, wherein said forming a first buffer region comprises deposition of a precursor containing said transition metal and said dopant.

13. A method as in claim 12, wherein said precursor is selected from a group consisting of a liquid precursor and a solid precursor.

14. A method as in claim 12, wherein said deposition is selected from a group consisting of MOCVD, spin on, dipping, liquid source misted deposition, and atomic region deposition (ALD).

15. A method as in claim 12, wherein said precursor includes no more than 0.2 mol of said dopant.

16. A method as in claim 12, wherein said precursor includes no more than 0.1 mol of said dopant.

17. A method as in claim 11, and further comprising forming a second buffer region between said second electrode and said resistive switching region.

18. A method as in claim 11, wherein said method is in a complementary metal-oxide-semiconductor (CMOS) process.

19. A resistive switching element comprising:
   a perovskite-type structure having a formula of RAOx, where A is selected from a group consisting of Ni, Ti, other transition metals, and a combination of the preceding group members; and R is selected from a group consisting of La, Y, Pr, Nd, and other rare earth elements; and Ox is a ligand containing oxygen; wherein the ligand is an extrinsic ligand which stabilizes valence states in coordination compounds of transition metals; said extrinsic ligand is selected from a group consisting of carbon, CO, carbonyls, and other carbon compound;

multiple layers of different thicknesses and different transition metal complexes with the extrinsic ligands; and wherein the perovskite-type structure includes a homojunction having various ratios of conductive-to-active layers thicknesses, said homojunction comprises an active region of YTiOx sandwiched between a first region of supersaturated and conducting NiO and a second region of supersaturated and conducting NiO.

20. A resistive switching element comprising:
   a perovskite-type structure having a formula of RAOx, where A is selected from a group consisting of Ni, Ti, other transition metals, and a combination of the preceding group members; and R is selected from a group consisting of La, Y, Pr, Nd, and other rare earth elements; and Ox is a ligand containing oxygen; wherein the ligand is an extrinsic ligand which stabilizes valence states in coordination compounds of transition metals; said extrinsic ligand is selected from a group consisting of carbon, CO, carbonyls, and other carbon compounds;

multiple layers of different thicknesses and different transition metal complexes with the extrinsic ligands; and wherein the perovskite-type structure includes a homojunction having various ratios of conductive-to-active layers thicknesses, said heterojunction comprises an active region of YTiOx sandwiched between a first region of a supersaturated NiO and a second region of supersaturated NiO.

21. A resistive switching memory comprising:
   a first electrode and a second electrode;
   an active resistive switching region between said first electrode and said second electrode, said resistive switching region comprising a rare earth oxide compound having the formula ReTiO3 or ReNiO3, where Re is a rare earth element, Yb, or Eu, and a dopant comprising a carbonyl ligand, said dopant having a first concentration; and
   a first buffer region between said first electrode and said resistive switching material, said first buffer region comprising said rare earth oxide compound and said dopant, wherein said dopant has a second concentration that is greater than said first concentration.

* * * * *